(12) United States Patent
Delacruz

(10) Patent No.: US 10,923,413 B2
(45) Date of Patent: Feb. 16, 2021

(54) HARD IP BLOCKS WITH PHYSICALLY BIDIRECTIONAL PASSAGEWAYS

(71) Applicant: Xcelsis Corporation, San Jose, CA (US)

(72) Inventor: Javier A. Delacruz, San Jose, CA (US)

(73) Assignee: Xcelsis Corporation, San Jose, CA (US)

(*) Notice: Subject to any disclaimer, the term of this patent is extended or adjusted under 35 U.S.C. 154(b) by 77 days.

(21) Appl. No.: 16/426,515

(22) Filed: May 30, 2019

(65) Prior Publication Data

US 2019/0371708 A1    Dec. 5, 2019

Related U.S. Application Data

(60) Provisional application No. 62/678,206, filed on May 30, 2018.

(51) Int. Cl.
| | | |
|---|---|---|
| H01L 23/48 | (2006.01) | |
| H01L 23/52 | (2006.01) | |
| H01L 29/40 | (2006.01) | |
| G06F 13/40 | (2006.01) | |
| H01L 23/528 | (2006.01) | |

(52) U.S. Cl.
CPC ........ *H01L 23/481* (2013.01); *G06F 13/4027* (2013.01); *H01L 23/528* (2013.01)

(58) Field of Classification Search
CPC .... H04L 47/34; G06F 13/4027; H01L 23/528
USPC .................................. 257/750, 798
See application file for complete search history.

(56) References Cited

U.S. PATENT DOCUMENTS

| | | | |
|---|---|---|---|
| 7,581,197 B2* | 8/2009 | Arunachalam | G06F 30/392 |
| | | | 716/119 |
| 9,432,298 B1* | 8/2016 | Smith | H04L 49/9057 |
| 2016/0335376 A1* | 11/2016 | Arunachalam | G06F 30/392 |

* cited by examiner

*Primary Examiner* — S. V. Clark
(74) *Attorney, Agent, or Firm* — Lerner, David, Littenberg, Krumholz & Mentlik, LLP

(57) ABSTRACT

Hard IP blocks, such as SerDes chips, are designed with keepout zones beneath the surface interconnects, the keepout zones being spaces within the chip where there is no circuitry. Connections can be formed between surface interconnects on an under surface of the SerDes chip that faces the host die, and surface interconnects on an upper surface of the SerDes chip that interfaces without external devices. Accordingly, redistribution layers routing around an outer periphery of the SerDes chip are no longer needed, and the resistive capacitive load remains low so as not to adversely impact transmitted signals.

18 Claims, 9 Drawing Sheets

HARD IP BLOCKS WITH PHYSICALLY BIDIRECTIONAL PASSAGEWAYS

CROSS-REFERENCE TO RELATED APPLICATIONS

This application claims the benefit of the filing date of U.S. Provisional Patent Application No. 62/678,206 filed May 30, 2018, the disclosure of which is hereby incorporated herein by reference.

BACKGROUND

Computation is gated by how fast data can be processed, and limited by the speed at which processors can get data in and out. Over the years, processors have become faster, up to approximately 3-4 GHz. To increase efficiencies between processors communicating with memories, further advanced computers included multiple processing cores, rather than further increasing speed of individual processors.

Using bonding techniques such as direct dielectric bonding, non-adhesive techniques, such as a ZiBond® direct bonding technique or a DBI® hybrid bonding technique, both available from Invensas Bonding Technologies, Inc. (formerly Ziptronix, Inc.), a subsidiary of Xperi Corp. (see for example, U.S. Pat. Nos. 6,864,585 and 7,485,968), processors can be physically positioned in close proximity to memory. This results in higher bandwidth access to data. However, there are challenges with getting processed data into the processor and out of the processor to an external node at high speeds comparable with the increased computing speeds.

A Serializer/Deserializer (SerDes) includes one or more pairs of functional blocks commonly used in high speed communications to compensate for limited input/output. These blocks convert data between serial data and parallel interfaces in each direction. SerDes have been used in computing devices, switches, routers, and the like. Existing SerDes operate at 28 Gbps, 56 Gbps, and faster speeds are in development.

FIGS. 1A-B illustrate an example of a conventional die 110 hosting a plurality of SerDes chiplets 120, where FIG. 1A is a top view and FIG. 1B is a side view. As shown, the die 110 is also hosting larger memory chiplet 130 and other chiplets 140, which may be any of a variety of types of chips, including analog. The SerDes chiplets 120 communicate signals from bond pads 125 to nodes external to the host die 110, such as to chips on a second die. To do so requires a redistribution layer 152 that goes beyond the chiplet 120 and then to pillars 154. However, when the signals are moving at speeds up to 56 Gbps and faster, having such a redistribution layer to move signals from the SerDes chiplet 120 on the host die 110 to a second die is inefficient, because the redistribution layer crates a big electrical load, which limits bandwidth. For example, for SerDes chiplets sending signals using PAM4 modulation, as the load increases, an eye of the PAM4 waveforms starts to shrink and it becomes difficult to differentiate between the four different levels of the PAM4 signal. For example, FIG. 1C illustrates an example eye diagram for a PAM4 signal, the signal including four levels (Level 0-Level 3). As the signals switch from one level to another, an eye is created, such as eye 0/1 between Level 0 and Level 1, eye1/2 between Level 1 and Level 2, etc. As shown in this example, the eyes of the waveforms are relatively distinct. However, a greater load would cause the switching between levels to be more gradual, and thus the eyes would shrink. Accordingly, signal transmission begins to fail.

While FIGS. 1A-B illustrate this problem with a face-to-face die, a similar problem exists using wafer-to-wafer designs. For example, a through-silicon via (TSV) would need to extend outside a perimeter of the SerDes chiplet, thereby creating a large resistive capacitive load, which impacts signal quality.

BRIEF SUMMARY

The present disclosure provides for hard IP blocks, such as SerDes chips, designed with keepout zones beneath the interconnects. The keepout zones are discrete areas or spaces within an active circuitry layer of the chip where there is no routing or active circuitry. In this regard, circuitry used to (de)serialize and drive signal bumps are positioned beneath a surface of the SerDes chip but are not located in an area directly below a region of the interconnect that faces the host die. Surface interconnects may be placed on an upper or lower surface of the SerDes chip in relation to the keepout zones, wherein the surface interconnections can interface with external devices. Accordingly, redistribution layers routing around an outer periphery of the SerDes chip are no longer needed, and the resistive capacitive load remains low so as not to adversely impact transmitted signals.

According to some examples, some surface interconnects may have keepout zones beneath them, while others do not. For example, while transmit and receive bumps may be made with keepout zones beneath them, power bumps may have a power mesh below them, and ground bumps may have ground below them.

One aspect of the disclosure provides a hard IP block defined by a base having a top surface and a bottom surface, the hard IP block comprising a circuitry layer within the base adjacent the top surface, one or more keepout zones within the circuitry layer, the one or more keepout zones defining spaces exclusive of circuitry, and one or more surface interconnects, each of the one or more surface interconnects being positioned on at least one of the top surface or the bottom surface of the hard IP block and in relation to the one or more keepout zones. Each of the one or more surface interconnects may be, for example, bumps, pads, or pillars positioned in longitudinal alignment with a corresponding one of the one or more keepout zones. For example, each of the one or more surface interconnects may be positioned at the top surface of the hard IP block. The one or more surface interconnects may alternatively or additionally be positioned at a bottom surface of the hard IP blocks, and one or more through-hole interconnects may extend from a connection point to the one or more surface interconnects at the top surface of the hard IP block, longitudinally through a corresponding one of the one or more keepout zones, and to the bottom surface of the hard IP block. The through-hole interconnects may be, for example, vias terminating at the one or more surface interconnects. The one or more keepout zones may be sized to have a keepout zone diameter that is based on a diameter of the one or more through-hole interconnects. The hard IP block may be, for example, a SerDes chiplet, gearbox, memory, analog block, or processing element.

Another aspect of the disclosure provides a system, comprising a hard IP block defined by a base having a top surface and a bottom surface. The hard IP block includes a circuitry layer within the base adjacent the top surface, one or more keepout zones within the circuitry layer, the one or more keepout zones defining spaces exclusive of circuitry and one or more surface interconnects, each of the one or more surface interconnects being positioned in relation to the one or more keepout zones. The system may further include a memory chiplet and a host die, wherein the hard IP block and the memory chiplet are positioned on the host die. The hard IP block may be face-to-face bonded to the host die, such as using non-adhesive direct bonding techniques. Each of the one or more surface interconnects may be positioned in longitudinal alignment with a corresponding one of the one or more keepout zones. The hard IP block may further comprise one or more through-hole interconnects, each of the one or more through-hole interconnects extending from a connection point to the surface interconnects at the top surface of the hard IP block, longitudinally through a corresponding one of the one or more keepout zones, and to the bottom surface of the hard IP block. The one or more surface interconnects may also be positioned at the bottom surface of the hard IP block and electrically connect with the through-hole interconnects.

Yet another aspect of the disclosure provides a 3D structure, comprising a hard IP block defined by a base having a top surface and a bottom surface, the hard IP block comprising a circuitry layer within the base adjacent the top surface, one or more keepout zones within the circuitry layer, the one or more keepout zones defining spaces exclusive of circuitry, one or more through-hole interconnects, each of the one or more through-hole interconnects extending from the top surface of the hard IP block, longitudinally through a corresponding one of the one or more keepout zones, and to the bottom surface of the hard IP block, and one or more surface interconnects, each of the one or more surface interconnects being positioned at the bottom surface of the hard IP block in longitudinal alignment with a corresponding one of the one or more keepout zones and being electrically connected to a corresponding one of the one or more through-hole interconnects. The 3D structure further comprises a host die, wherein the hard IP block is face-to-face bonded with the host die, such that the bottom surface and the one or more surface interconnects face away from the host die, and a second layer device coupled to the one or more surface interconnects at the bottom surface of the hard IP block.

DETAILED DESCRIPTION

Figure 1A:
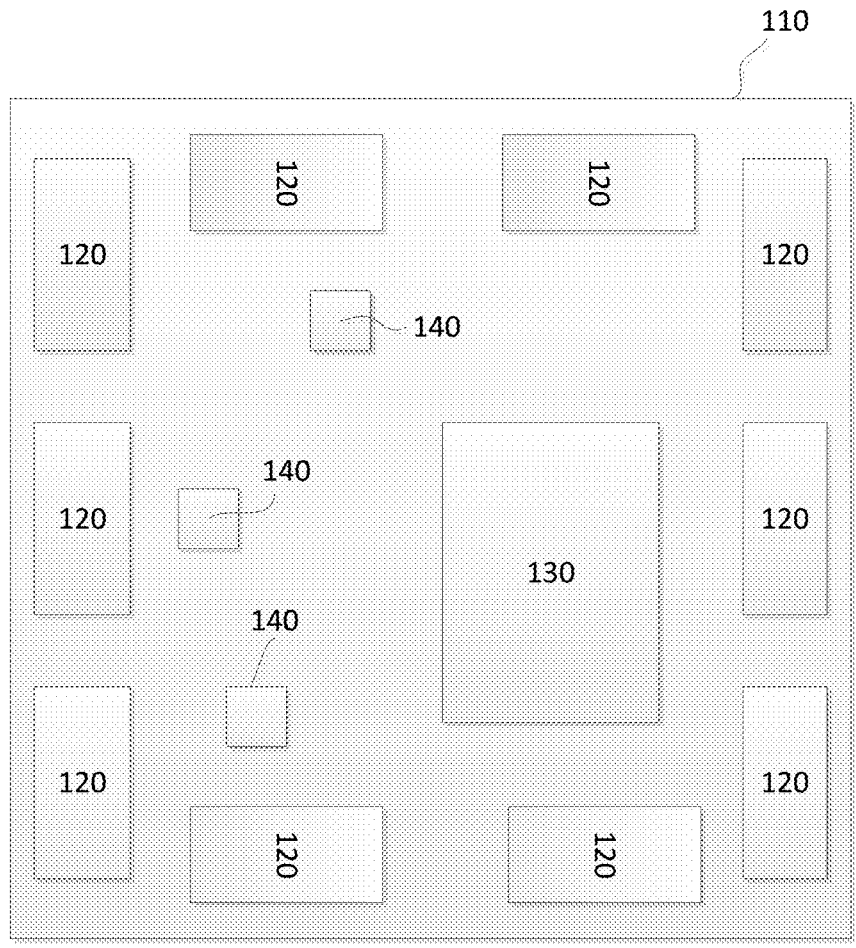
FIGS. 1A-B are top and side view of SerDes chiplets on a host die according to the prior art.
Figure 1B:
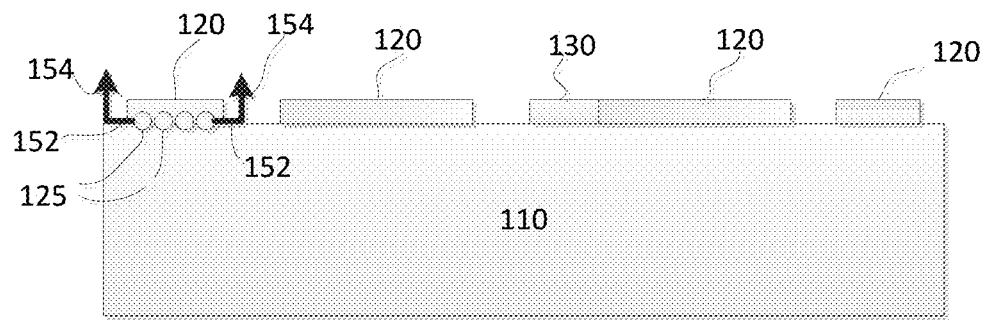
Figure 1C:
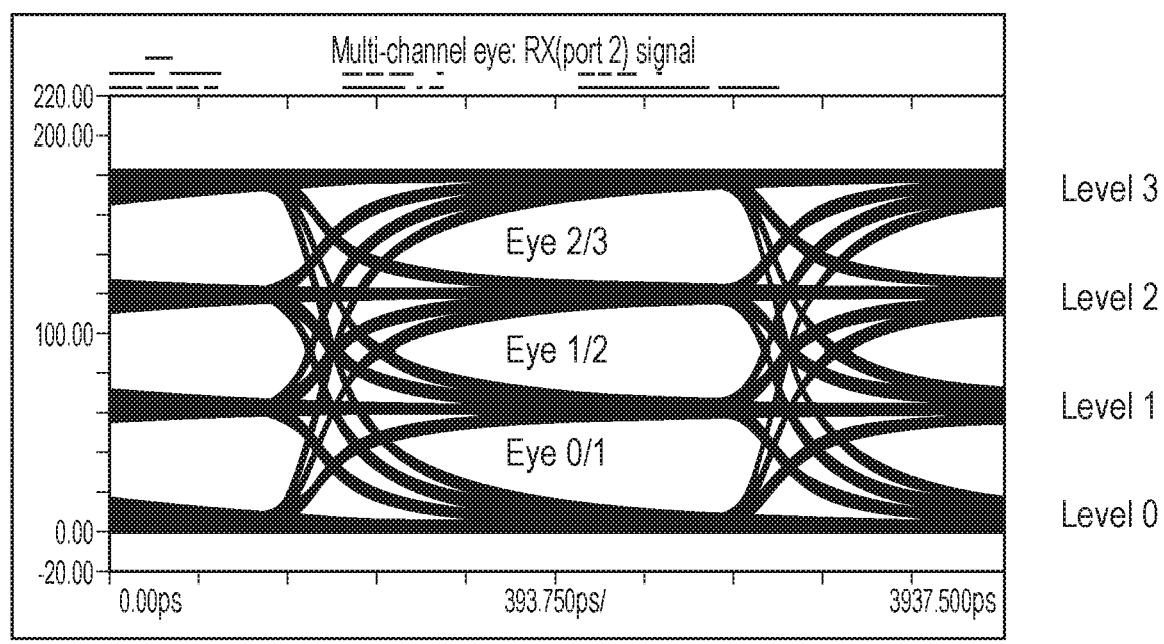
FIG. 1C is an example of a conventional PAM4 eye diagram.
Figure 2:
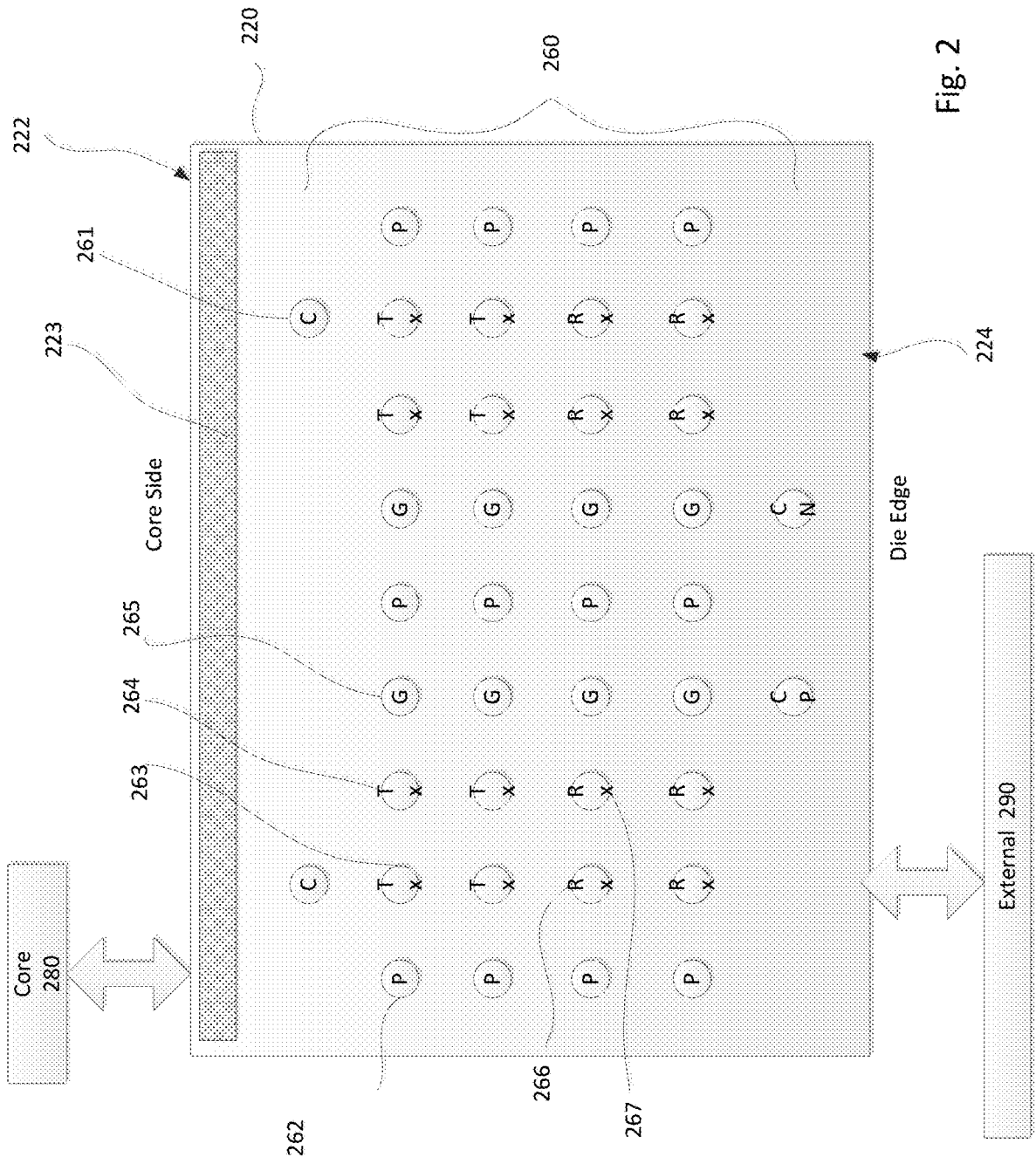
FIG. 2 is a top view of an example SerDes chiplet according to aspects of the disclosure.

FIG. 2 illustrates a top view of an example configuration of a hard IP block, particularly a SerDes chip 220, including a plurality of surface interconnects 260. The surface interconnects 260 may be bumps, pads, or any other type of interconnect. Such interconnects include core power 261, power 262, ground 265, transmit pairs 263-264, receive pairs 266-267, positive and negative clocks, etc. A first side 222 of the chip 220 is referred to as a "core side" and is used for communicating with a core 280. As shown, the core side includes dense interconnects 223. A second side 224 is a die edge 224, and faces a periphery of the die hosting the SerDes block 220. The second side 224 may include much fewer interconnects than the core side 222, and maybe used to interface with external devices 290. In this regard, the SerDes chip 220 is able to take more highly-parallel, low-speed, low-voltage signals from the core side 222, serialize the received signals together, send the serialized signals out to the external node 290 through different transmit/receive pairs at a faster data rate. Conversely, the transmit/receive pairs may also be used to deserialize signals received from the external node 290 to a lower data rate, and transmit such deserialized signals to the core 280.

The surface interconnects 260 may be any device for establishing electrical contact. For example, the surface interconnects 260 may be bumps, pads, pillars, or any other type of interconnect. While in some examples herein such interconnects are referred to as bumps, but it should be understood that other types of interconnects may alternatively or additionally be used.

According to the present disclosure, and as described further below, signals may also be transmitted through the bumps 261-267 in a direction perpendicular to a plane extending along a top surface of the SerDes chip 220. As such, the SerDes chip 220 is configured to be bonded to further structures, such as to create a 3D design.

Figure 3A:
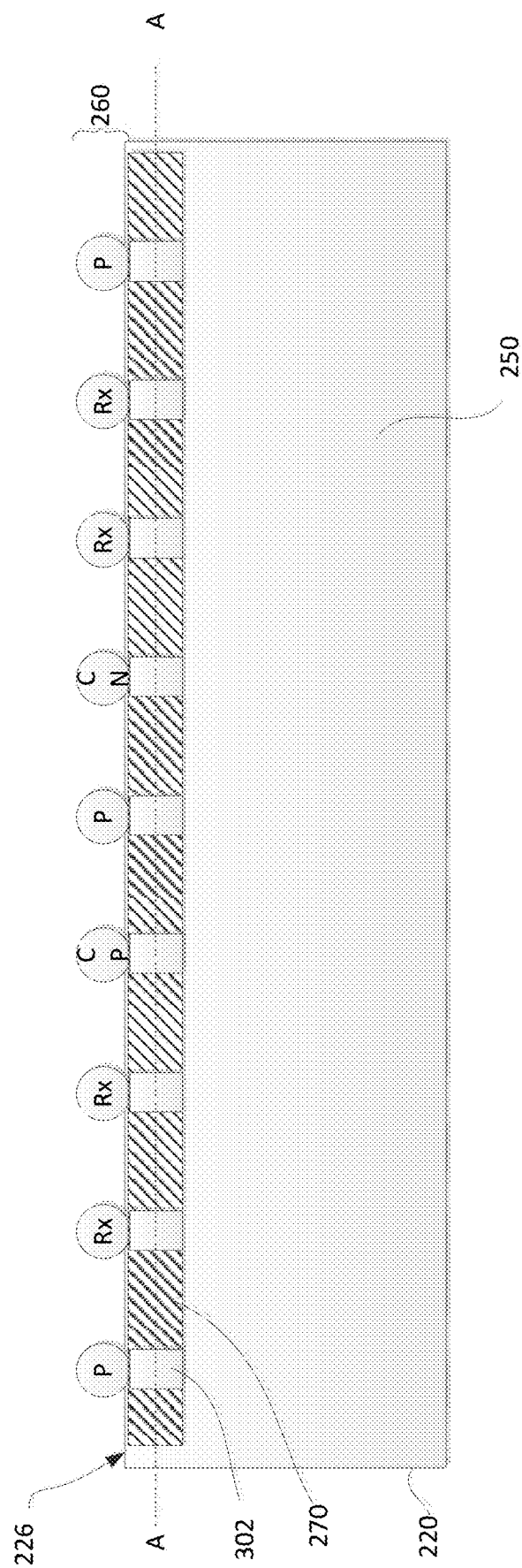
FIG. 3A is a cutaway side view of an example SerDes chiplet according to aspects of the disclosure.

FIG. 3A illustrates a cutaway side view of such SerDes chip allowing for transmission of signals in a direction that is orthogonal to a plane extending along a top surface 226 of the SerDes chip 220. The SerDes chip 220 includes a base 250, which may be a silicon substrate or other semiconductor material, such as Gallium Arsinide, Indium Phosphide, or other similar material. Circuitry 270 extends across the base 250. The circuitry 270 may include active circuitry for the chip 220, and/or routing. While the circuitry 270 is illustrated in FIG. 3A as a single layer, it should be understood that the circuitry 270 may be multiple layers, such as a routing layer and an active circuitry layer. In other examples the routing and active circuitry may be interspersed in the same layer.

Figure 3B:
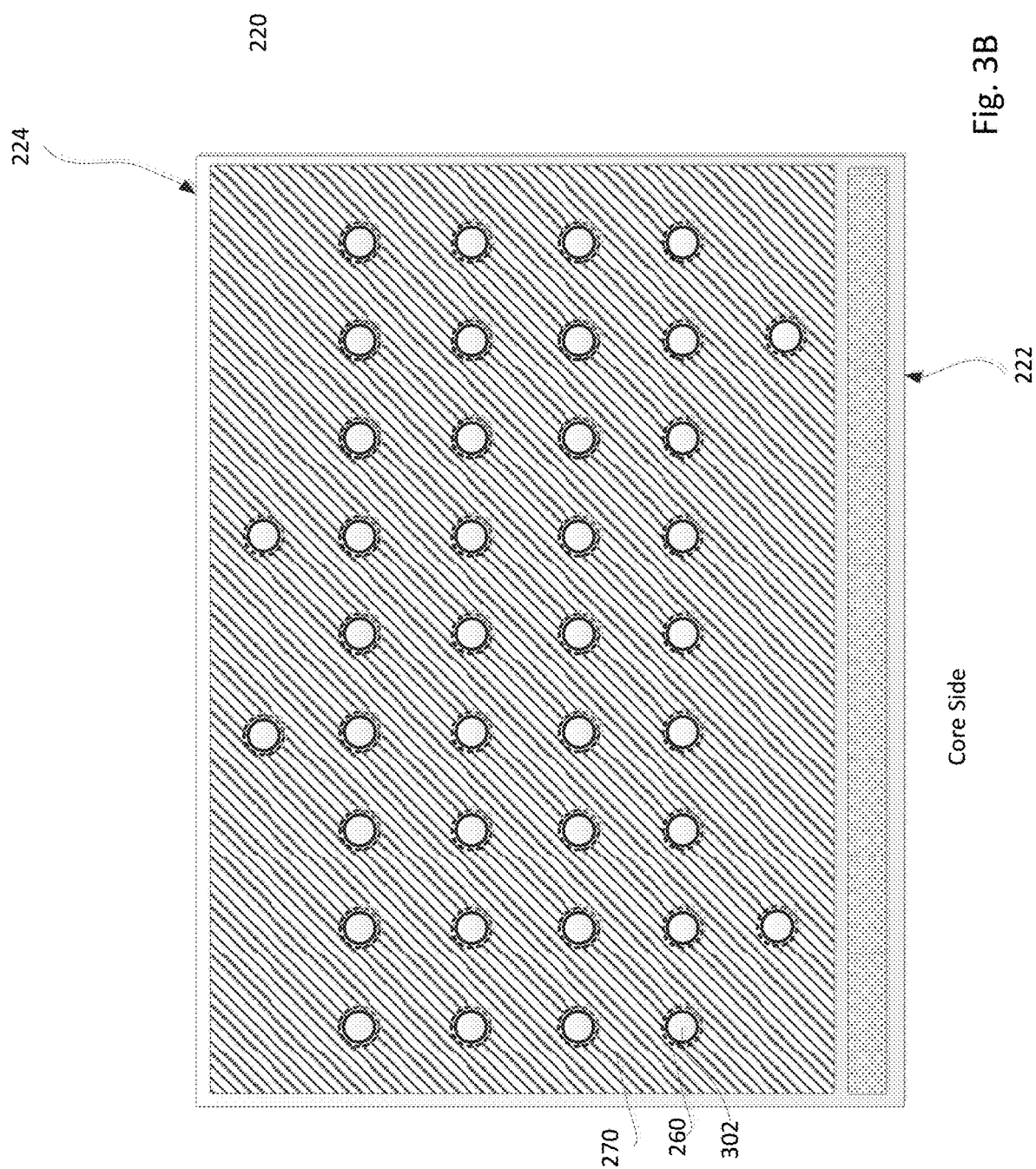
FIG. 3B is a cutaway bottom view of the example SerDes chiplet of FIG. 3A.

While the circuitry 270 extends beneath the top surface 226 of the chip 220, a plurality of keepout zones 302 are positioned within the circuitry 270 and in relation to the interconnects 262, 265, 266, 267, etc. For example, the keepout zones 302 may be positioned directly beneath the interconnects 260. The keepout zones 302 are discrete areas or spaces within the layer of circuitry 270 where there is no active circuitry or routing. In this regard, circuitry used to serialize and deserialize and drive signal bumps are positioned beneath a surface of the chip 220, but are not located in an area directly below a region of the interconnect that faces the host die. For example, a layout of the chip is designed such that the circuitry 270 is positioned around the keepout zones 302, as shown in FIG. 3B discussed further below. Accordingly, the keepout zones 302 may extend a depth towards a bottom surface of the chip 220, wherein the depth is as least as deep as a depth of the circuitry 270.

According to some examples, there may be circuitry keepout zones that are distinct from routing keepout zones. For example, for a given surface interconnect, there may be a routing keepout zone within a routing layer beneath the given surface interconnect, and a distinct circuitry keepout zone within an active circuitry layer beneath the surface interconnect. In other examples, some surface interconnects may have circuitry keepout zones beneath them if only active circuitry is positioned beneath such interconnects, while other surface interconnects of the same hard IP block have only routing keepout zones if only routing is positioned beneath such interconnects. In either example, the circuitry keepout zones may be the same size and shape, or differently sized and shaped, as compared to the routing keepout zones.

The keepout zones 302 may be filled with material having low or no conductivity, such as a dielectric. For example, the dielectric may form a layer over the base, and routes in a routing layer extend through the dielectric. The dieletric may include, for example, undoped silicate glass (USG), silicon oxide, silicon nitride, high-k, low-k, or the like. The dielectric or other materials may be removed as needed, such as by etching or the like.

FIG. 3B provides a planar cross-sectional view from an under side of the SerDes chip 220, such as along line A-A of FIG. 3A. As such, FIG. 3B illustrates the keepout zones 302 through circuitry 270, in relation to surface interconnects 260 at a top surface of the chip 220. In this example, the keepout zones 302 are illustrated as having a radial cross-section, for example, the keepout zones 302 may be substantially cylindrical. However, it should be understood that in other examples, the keepout zones 302 may have different shapes. For example, a cross-section of the keepout zone may be substantially square, rectangular, octagonal, or other shape. As such, the keepout zones may be substantially cubical, rectangular prism, octahedron, etc. In further examples, a size or shape of the keepout zones 302 may change from one cross-section to another within the same keepout zone, or from one keepout zone to another. In such examples, the SerDes chip may be designed by specifying a minimum distance from a center position for the keepout zone, and the remainder of the shape for the keepout zone may be determined by efficient circuitry placement.

According to some examples, the keepout zones 302 may be designed based on a planned diameter of a via to be placed therein. For example, the diameter of the keepout zone 302 may be a multiple of the via diameter, such as 1.5 times the diameter of the via, 3 times the diameter, 5 times, etc. By way of example only, a keepout zone for a Sum via with a circular cross-section may be about 15 um with an octagonal cross-section. The size of the keepout zone 302 may be varied based on, for example, an amount of stress induced on an active silicon area by a change in material between silicon and the via materials (e.g., copper or other via materials).

Moreover, the keepout zone size for the circuits may be different than the keepout zone size for routing. For example, as discussed further below, vias or other types of through-hole interconnects may extend through the keepout zones from the surface interconnects on one surface of the chip to an opposing surface. Routing may be positioned closer to the vias, as they are less sensitive to the stress induced by the vias than the circuitry may be.

In addition, there may be different keepout zones per layers stacked in the chip 220. For example, the front end of line (FEOL), such as the circuit layers and first few routing layers, may have one set of constraints, while back end of line (BEOL) may have a different set of constraints. Further, within the FEOL or BEOL, the keepout zones may be different. For example, the keepout zone for a first routing layer may have different size constraints than the keepout zone for a second routing layer.

While in FIG. 3B, the SerDes chip 220 includes a keepout zone 302 for each surface interconnect 260, in other examples the keepout zones 302 may only be placed in relation to selected surface interconnects. By way of example, transmit and receive pairs may have keepout zones beneath them, while power and ground do not. In other examples, only selected transmit and receive pairs may have keepout zones beneath them, while other transmit and receive pairs do not.

Figure 4A:
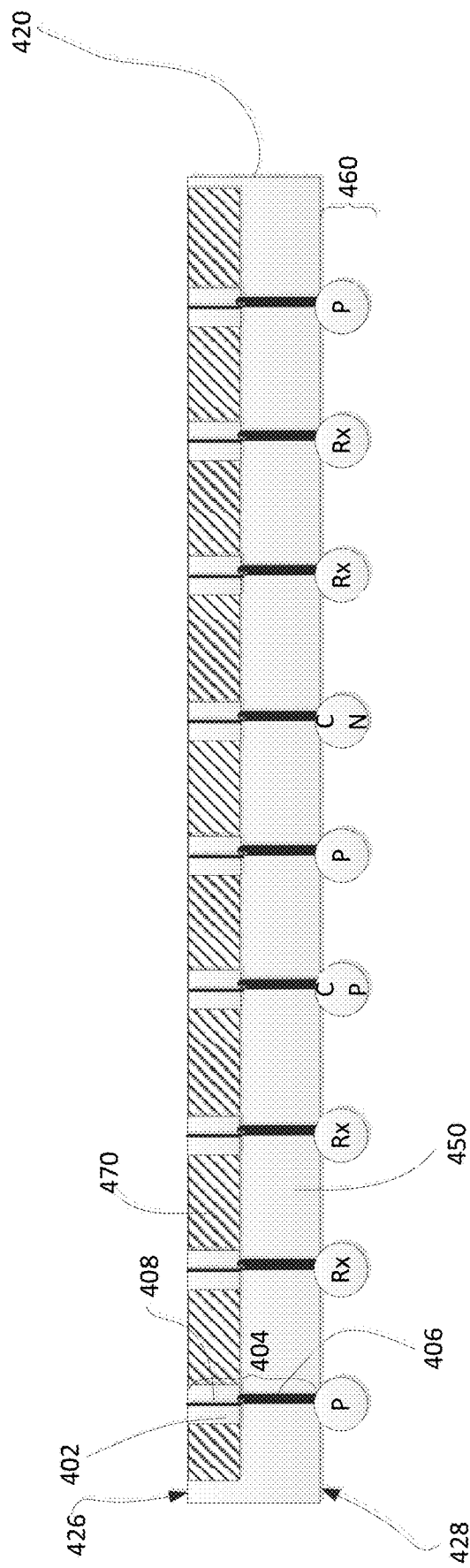
FIG. 4A is a cutaway side view of another example SerDes chiplet according to aspects of the disclosure.

FIG. 4A illustrates a cutaway side view of another embodiment where through-hole interconnects 404 are placed within keepout zones 402, and extend longitudinally through chip 420. In this example, the through-hole interconnects 404 create a path through the chip 420 for electrical connection between interconnects at top surface 426 and a bottom surface 428. In this example, surface interconnects are not shown at the top surface 426, and instead surface interconnects 460 are positioned at the bottom surface 428 of the chip 420. The surface interconnects 460 may be the same as the surface interconnects 260 of FIG. 3A, but moved to a different position. For example, the surface interconnects 260 may be moved to a backside of the chiplet in a mirror image of what is seen on a face of the chiplet.

As shown, through-hole interconnect 404 includes a through-silicon via (TSV) 406 that extends through a base 450 of the chip 420 up to routing/active layers 470. The routing/active layers may include, for example, an implant layer and multiple layers of routing and active circuitry. For example, the routing/active layers 470 may include up to 18 layers or more. The TSV 406 may extend up to the implant layer, $1^{st}$ layer, $2^{nd}$ layer, $3^{rd}$ layer, etc. The TSV 406 may then couple to interconnects 408 in the layers of the routing/active layers 470 above it. Such interconnects 408 may couple to surface interconnects at the top surface of the chip.

According to some embodiments, the hard IP block may include routing under each surface interconnect, but not circuitry. In such embodiments, a via may be vertically aligned each surface interconnect on the front surface and/or the back surface. However, in a region of the keepout zone, a signal may jog around the routing to couple the via to the surface interconnect.

According to a further embodiment, the via may not be vertically aligned with the surface interconnect. Rather, the via may be slightly displaced in a lateral direction. In this regard, an electrically short redistribution may couple the via to the surface interconnects. The surface interconnects would remain aligned with each other with the via slightly displaced.

According to some other examples, the through-hole interconnects 404 may each be a continuous via, wherein a first end of the via remains available for coupling at the top surface 426 of the chip 420 and extends through keepout zones 402, and a second end of the via couples to the surface interconnects 460 positioned at the bottom surface 428 of the SerDes chip 420.

Accordingly, such through-hole interconnects 404 are available to be connected at the first end to another device, such as a host die, a substrate, or any other device. For example, the through-hole interconnects 404 may be coupled using bonding techniques such as Zibond or DBI. In this regard, signals may be transmitted through the chip 420 by the through-hole interconnects 404 in a direction extending from the top surface 426 to the bottom surface 428, and vice versa.

The through-hole interconnects 404 may be made of, for example, a conductive metal, such as copper, silver, gold, aluminum, brass, nickel, or any other conductive metal. For example, where the through-hole interconnect 404 includes a via, the via may have a liner around an inner portion creating a passageway, and/or around an outer portion between the via and a periphery of the keepout zone. The liner may be made of a material with lower or no conductivity, such as silicon oxide, or any of a variety of other materials. In some examples, the liner may include multiple layers where at least one of the layers is electrically non-conductive or barely conducting.

Figure 4B:
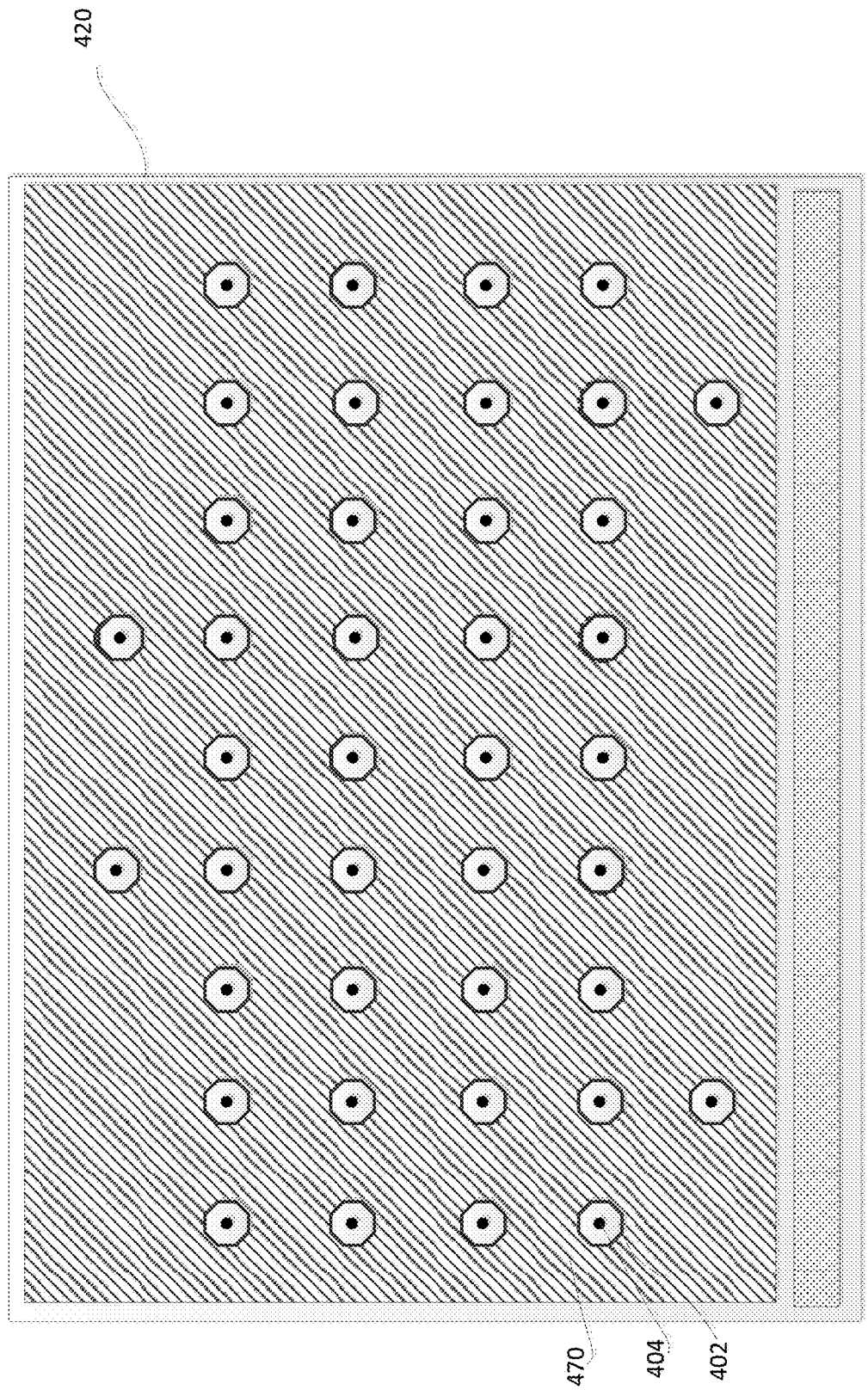
FIG. 4B is a cutaway bottom view of the example SerDes chiplet of FIG. 4A.

In this illustration of FIG. 4B, the through-hole interconnects 404 are shown as having a circular cross-section and the keepout zones 402 are shown as having octagonal cross-sections. However, as discussed above in connection with FIGS. 3A-B, the keepout zones 402 may have any of a variety of different shaped cross-sections, or different shaped profiles, etc. Similarly, the through-hole interconnects 404 may alternatively have rectangular cross-sections or may have any of a variety of shapes.

While the disclosure primarily describes an electrically conductive bidirectional passageway through the keepout zones 402 as vias, it should be understood that other types of interconnections between the top and bottom surfaces of the chip are possible. For example, pillars, electrical traces, wirebonding, or other techniques may be used in addition, or in the alternative, to vias.

The surface interconnects 460 are then ready for a next level of integration, such as bonding to a package. For example, the chip 420 may be bonded to a host die or other device using a non-adhesive or direct bonding technique or hybrid bonding technique, such as Zibond or DBI. For example, the top surface 426 may be bonded to the host device, such that the surface interconnects 460 may be used for interconnection to an external device, such as a device in another level of a 3D stack. By way of example only, such external device may include a system on chip (SoC), processor, graphics processor, neural network, microcontroller, or other similar device.

Figure 5:
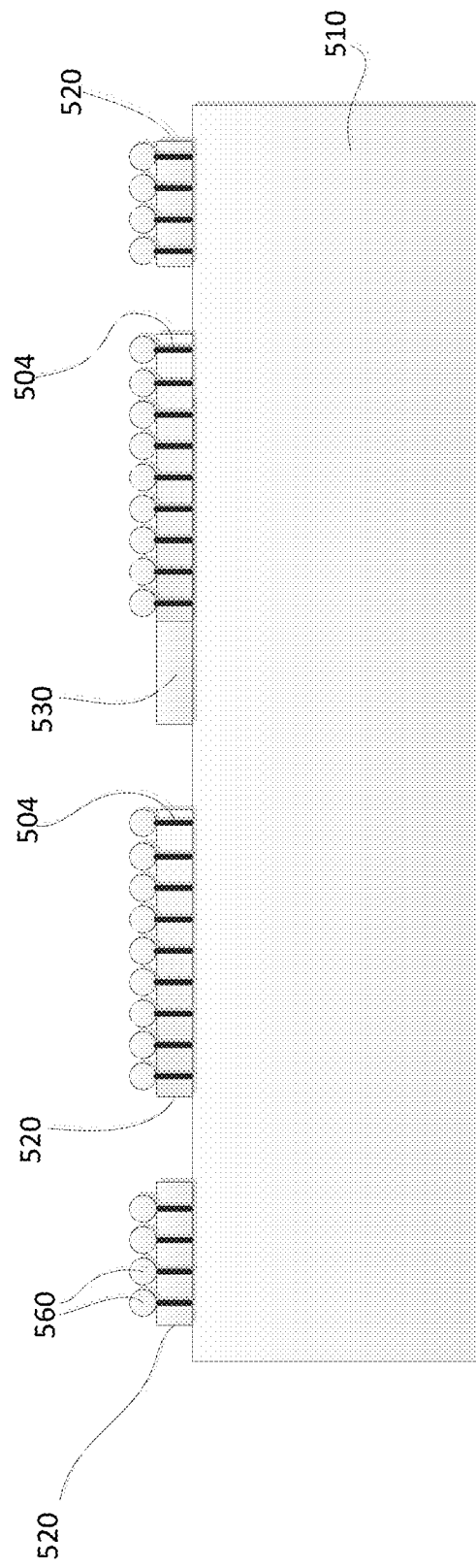
FIG. 5 is a side view of an example SerDes chiplet face-to-face bonded with a host die according to aspects of the disclosure.

FIG. 5 illustrates an example of multiple SerDes chiplets 520 bonded to a host die 510 using the techniques described above in FIGS. 3A-4B. In this example, the SerDes chiplets 520 are face-to-face bonded with the host die 510. The host die 510 may be any package substrate or die or wafer. Signals from the host die 510 may be transmitted through through-hole interconnects 504 extending through the chiplets 520 from a first surface at a face of the chiplet to a second surface at a back of the chiplet. Such through-hole interconnects 504 are made possible by keepout zones (not shown) formed in the SerDes chiplets 520, the keepout zones providing areas free of circuitry such that the through-hole interconnects 504 may be formed therethrough. Surface interconnects 560 are positioned at the second surface of the chiplet at an end of the through-hole interconnects 504, such surface interconnects 560 enabling further interconnection with other devices in a next level of integration.

Though not shown in FIG. 5, in some examples other chiplets, such as memory 530, may have surface interconnects as well. For example, the memory 530 memory may be larger in size and use the through-hole interconnects to supply power and ground. Accordingly, in such examples the memory 530 or other chiplets may also be directly bonded to the host die 510. Further, such other chiplets may also be designed with keepout zones, allowing for through-hole interconnects to extend therethrough for transmission of signals through the other chiplets.

While in FIG. 5 the SerDes chiplets 520 are face-to-face bonded with the die 510, in other embodiments the chiplets may alternatively be face-to-back bonded, such that the bottom surface of the SerDes chip is bonded to a top surface of the die. In this regard, an active side of the SerDes chip available for coupling to a next level, a package substrate, or other device as it is open-facing. However, this may cause the dense core-side interconnects to be in a less optimal position.

Figure 6:
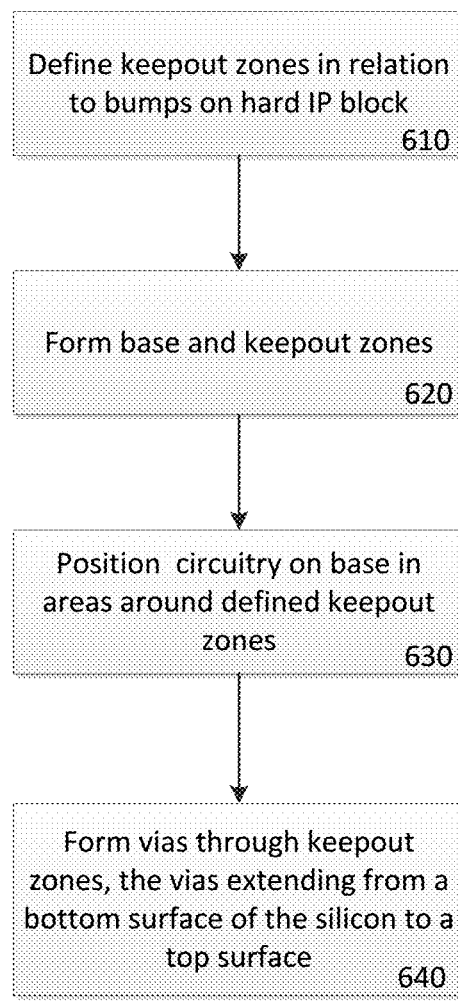
FIG. 6 is a flow diagram illustrating a method of fabricating SerDes chips according to aspects of the disclosure.

In FIG. 6, a method 600 of fabricating a hard IP block having keepout zones is described. While the operations associated with the method 600 are described in a particular order, it should be understood that they may be performed in a different order or simultaneously. Moreover, operations may be added or omitted.

In step 610 keepout zones are defined in relation to surface interconnects of a hard IP block. The keepout zones may be defined using, for example, a computer-assisted drawing (CAD) tool that lays out the components of the hard IP block for creation through an automated or semi-automated process, such as a wafer fabrication tooling process capable of submicron feature definition. According to some examples, the keepouts may be defined using one or more sets of rules or instructions, such that each time a surface interconnect placement is selected or other defined, a keepout zone is automatically created underneath the surface interconnect. The rules or instructions may set parameters that define a size and shape of the keepouts, such as parameters based on other components (e.g., vias, circuitry, materials, etc.). Alternatively, placement of the keepout zones may be manually defined by an operator.

In step 620, a base for the hard IP block may be formed, such as by depositing silicon or other dielectric material in an additive process. For example, the silicon or other dielectric may be added as a film, spun-on, or chemical vapor deposited, etc. The silicon or other dielectric material may be deposited into the defined keepout zones.

In step 630, circuitry is positioned on the base in areas around the keepout zones. In other words, the circuitry is positioned such that it does not extend into any of the defined keepout zones. The silicon or other dielectric material in the keepout zones may serve as guideposts for positioning the circuitry, and may also serve as a barrier for preventing the circuitry from being positioned in the keepout zones. According to the example where automated or semi-automated processes are used for fabricating the hard IP blocks, automatic routers may be programmed to avoid the areas defined as keepout zones. Positioning the circuitry may also include forming interconnects, such as dense core interconnects and/or die side interconnects.

In block 640, through-hole interconnects are formed through the keepout zones, the through-hole interconnects extending from a bottom surface of the base to a top surface beyond the circuitry. For example, the through-hole interconnects may be formed by depositing copper within a portion of the keepout zones. Where the keepout zones were temporarily filled with a material, such material may be partially or wholly removed prior to or during depositing of the through-hole interconnects. Though not shown in FIG. 6, surface interconnects may also be formed, such as at a top surface of the hard IP block or a bottom surface of the hard IP block, relative to the keepout zones and the through-hole interconnects.

The techniques described herein may be applied to die-to-wafer implementations, wafer-to-wafer implementations, etc. While the techniques described above are primarily described in connection with SerDes chips, it should be understood that such techniques may be implemented in any type of hard IP block, including gearbox, memory, analog block, processing element, or the like.

Designing hard IP blocks in this manner allows for them to be used in a monolithic layout, a 2D layout, or in further stacked arrays. By creating a direct physical bidirectional passageway through the hard IP blocks, a resistive capacitive load is significantly reduced as compared to routing signals around the hard IP blocks in a redistribution layer. In this regard, signals may be transmitted with greater speed and accuracy and with reduced power consumption.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A hard IP block defined by a base having a top surface and a bottom surface, the hard IP block comprising:
   a circuitry layer within the base adjacent the top surface;
   one or more keepout zones within the circuitry layer, the one or more keepout zones defining spaces exclusive of circuitry; and
   one or more surface interconnects, each of the one or more surface interconnects being positioned on at least one of the top surface or the bottom surface of the hard IP block and in relation to the one or more keepout zones.

2. The hard IP block of claim 1, wherein each of the one or more surface interconnects is positioned in longitudinal alignment with a corresponding one of the one or more keepout zones.

3. The hard IP block of claim 2, wherein each of the one or more surface interconnects is positioned at the top surface of the hard IP block.

4. The hard IP block of claim 2, further comprising:
   one or more through-hole interconnects, each of the one or more through-hole interconnects extending from a connection point to the one or more surface interconnects at the top surface of the hard IP block, longitudinally through a corresponding one of the one or more keepout zones, and to the bottom surface of the hard IP block.

5. The hard IP block of claim 4, wherein the one or more surface interconnects are also positioned at the bottom surface of the hard IP block and electrically connect with the through-hole interconnects.

6. The hard IP block of claim 4, wherein the one or more through-hole interconnects are vias terminating at the one or more surface interconnects.

7. The hard IP block of claim 4, wherein the one or more keepout zones are sized to have a keepout zone diameter that is based on a diameter of the one or more through-hole interconnects.

8. The hard IP block of claim 1, wherein the one or more surface interconnects are one of bumps, pads, or pillars.

9. The hard IP block of claim 1, wherein the keepout zones comprise dielectric.

10. The hard IP block of claim 1, wherein the hard IP block is one of a SerDes chiplet, gearbox, memory, analog block, and processing element.

11. A system, comprising:
    a hard IP block defined by a base having a top surface and a bottom surface, the hard IP block comprising:
    a circuitry layer within the base adjacent the top surface;
    one or more keepout zones within the circuitry layer, the one or more keepout zones defining spaces exclusive of circuitry; and
    one or more surface interconnects, each of the one or more surface interconnects being positioned on at least one of the top surface or the bottom surface of the hard IP block and in relation to the one or more keepout zones;
    a memory chiplet; and
    a host die, wherein the hard IP block and the memory chiplet are positioned on the host die.

12. The system of claim 11, wherein the hard IP block is face-to-face bonded to the host die.

13. The system of claim 12, wherein the hard IP block is bonded to the host die using a non-adhesive direct bonding technique.

14. The system of claim 11, wherein each of the one or more surface interconnects is positioned in longitudinal alignment with a corresponding one of the one or more keepout zones.

15. The system of claim 14, wherein the hard IP block further comprises one or more through-hole interconnects, each of the one or more through-hole interconnects extending from a connection point to one or more surface interconnects at the top surface of the hard IP block, longitudinally through a corresponding one of the one or more keepout zones, and to the bottom surface of the hard IP block.

16. The system of claim 15, wherein the one or more surface interconnects are also positioned at the bottom surface of the hard IP block and electrically connect with the through-hole interconnects.

17. The system of claim 11, wherein the hard IP block is face-to-back bonded to the host die, such that a back of the hard IP block is bonded to a face of the die.

18. A 3D structure, comprising:
    a hard IP block defined by a base having a top surface and a bottom surface, the hard IP block comprising:
    a circuitry layer within the base adjacent the top surface;
    one or more keepout zones within the circuitry layer, the one or more keepout zones defining spaces exclusive of circuitry;
    one or more through-hole interconnects, each of the one or more through-hole interconnects extending from the top surface of the hard IP block, longitudinally through a corresponding one of the one or more keepout zones, and to the bottom surface of the hard IP block; and
    one or more surface interconnects, each of the one or more surface interconnects being positioned at the bottom surface of the hard IP block in longitudinal alignment with a corresponding one of the one or more keepout zones and being electrically connected to a corresponding one of the one or more through-hole interconnects;
    a host die, wherein the hard IP block is face-to-face bonded with the host die, such that the bottom surface and the one or more surface interconnects face away from the host die; and
    a second layer device coupled to the one or more surface interconnects at the bottom surface of the hard IP block.

* * * * *